United States Patent [19]
Buckley
[11] 4,293,624
[45] Oct. 6, 1981

[54] METHOD FOR MAKING A MASK USEFUL IN X-RAY LITHOGRAPHY

[75] Inventor: William D. Buckley, Easton, Conn.
[73] Assignee: The Perkin-Elmer Corporation, Norwalk, Conn.

[21] Appl. No.: 52,292
[22] Filed: Jun. 26, 1979
[51] Int. Cl.$^{3}$ .......................... H05G 1/00; G21F 1/12
[52] U.S. Cl. ........................................ 430/5; 250/514; 427/96; 427/108; 427/160; 430/314; 430/321; 430/966
[58] Field of Search ................... 430/5, 314, 321, 966; 427/96, 108, 160; 250/514

[56] References Cited

U.S. PATENT DOCUMENTS 3,767,398 10/1973 Morgan ............................... 430/314
4,018,938 4/1977 Feder et al. ............................ 430/5
4,022,927 5/1977 Pfeiffer et al. ......................... 430/5
4,035,522 7/1977 Hatzakis ................................. 430/5
4,037,111 7/1977 Coquin et al. .......................... 430/5
4,174,219 11/1979 Andres et al. ...................... 430/321

*Primary Examiner*—John D. Smith
*Attorney, Agent, or Firm*—S. A. Giarratana; E. T. Grimes; T. P. Murphy

[57] ABSTRACT

In order to make a mask for use in lithography a layer of reflective material is first deposited on a substrate which is transparent to the radiation with which the mask is to be used; a layer of photoresist then deposited; the photoresist exposed with the desired pattern by UV radiation; the photoresist developed to expose the reflective material in the areas where it is desired to deposit an absorber material; the reflective material etched away from these areas undercutting the resist; the absorber deposited through the openings in the resist and reflective layer and the resist then lifted off.

12 Claims, 8 Drawing Figures

METHOD FOR MAKING A MASK USEFUL IN X-RAY LITHOGRAPHY

BACKGROUND OF THE INVENTION

This invention relates to masks used in lithography and more particularly to a method of making a mask which can be used for X-ray lithography.

In the manufacture of integrated semiconductor circuits various types of lithography are used in order to expose a photoresist which is deposited on the semiconductor wafer. With requirements for miniaturization, and placing more devices on a given chip, lithography has progressed toward shorter wave lengths. Shorter wave lengths are necessary in order to obtain good resolution and small size. Thus, there has been a progression from optical lithography utilizing the visible spectrum to ultraviolet [UV] lithography and more recently to X-ray lithography, X-rays having a particularly short wave length and permitting particularly fine lines to be defined, such as for example, X-rays in the range of from 4 to 50 angstroms, and more usually in the range of from 4 to 13 angstroms. In such lithography, a mask having the desired pattern thereon is interposed between the source of radiation, e.g. UV or X-ray, and a semiconductor substrate coated with the resist on which the pattern is to be exposed. The mask must result in good definition of the lines being exposed with the masked area opaque to the radiation being used and the mask substrate transparent to that radiation. Because of the small line widths which it is desired to achieve in X-ray lithography, the making of a mask which will provide good resolution becomes a problem.

The typical material used as an absorber on the mask used in X-ray lithography is gold. Although other elements exhibit an increase in soft X-ray absorption, gold is notably easier to work with.

The thickness of the gold absorber is determined by the contrast requirements of the X-ray photoresist. For low sensitivity, high contrast photoresist such as PMMA, 0.2 to 0.3 microns is adequate. However, for the high sensitivity low contrast photoresist which is required for short exposure times, gold thickness in the range of from 0.5 to 0.8 microns is required. Furthermore, if submicrometer features are to be replicated, it is necessary that the gold absorber pattern have a square edge profile. In other words, square edges are essential if small features are packed close together. Since attenuation varies exponentially with thickness, a sloping edge profile will result in loss of edge acuity during X-ray exposure, which can lead to line width control difficulties and photoresist thickness variations where a negative photoresist is used.

The conventionally utilized photolithography and etch techniques use chemical etchings to delineate the gold absorber patterns. These procedures result in undercutting of the photoresist at the pattern edges and sloping edge profiles are generally obtained. Two other known processes, one of wich is a physcial etch technique known as the "lift-off" process and a process known as sputter etching are generally more successful in producing the desired square edge profiles.

In the lift-off technique, a photoresist is deposited on a substrate which is transparent to the X-ray radiation. The photoresist is exposed with the desired pattern and the photoresist developed so as to expose the substrate in the areas where it is desired to deposit gold. This exposure results in an undercutting of the photoresist. Thereafter, a thin adhesion layer of chromium is deposited followed by the deposit of a layer of gold. Success with this technique requires the undercut photoresist profile to prevent a continuous film of gold from covering the steps in the photoresist. Consequently, the gold thickness is limited to about two-thirds of the photoresist thickness and approximately one micron of photoresist is required to define the gold absorber thickness [0.6 microns]. The use of thick photoresist limits the resolution and the minimum line width that can be produced.

The lft-off technique has normally employed photoresist patterns defined by electron beam exposure in order to produce the undercut profile. Although lift-off can be achieved with the square profiles that can be produced by ultraviolet exposure of positive photoresist, there is a tendency to tear the gold at the edges of the feature and hence produce a ragged edge profile. Furthermore, the process cannot be used to define isolated features. An island of photoresist cannot be lifted reliably because there is no access to the photoresist for the solvent.

The other prior art method, i.e., sputter etching, gives a fairly steep angle of about 70° but this is still a limitation. Furthermore, the sputter etching process is much more complex than the lift-off technique.

Additional information concerning the processes under consideration herein and varius prior art proposals may be obtained from the following references:

REFERENCES

1. W. D. Buckley, "Factors which Determine the Exposure Time in an X-Ray Lithography Exposure System", *Proceedings of the Symposium on Electron and Ion Beam Science and Technology,* 7th International Conference, Washington, 1976, pps 454–463.
2. D. Maydan, G. A. Coquin, J. R. Maldonado, S. Somekh, D. Y. Lou and G. N. Taylor, "High Speed Replication of Submicron Features on Large Area, by X-Ray Lithography", *IEEE Trans. on Electron Devices, ED-2,* 429, (1979).
3. E. Bassous, R. Feder, E. Spiller, J. Topalian, "High Transmission X-Ray Masks for Lithographic Applications", *Solid State Technology,* September 1976, pp 5558.
4. B. L. Henke, R. L. Elgin, R. E. Lent, R. B. Hedingham, "X-Ray Absorption in the 2 to 200A Region", *Norelco Report* 14, 122–131, 1967.

SUMMARY OF THE INVENTION

It is thus the object of the present invention to provide an improved mask making process which does not suffer from the disadvantages of the prior art processes and which gives the required thickness of gold absorbers with a square edge profile without the need for electron beam exposure or sputter etching.

The present invention accomplishes this object in a process in which a layer of material, which reflects the radiation wavelength which is used to expose the photoresist, e.g., aluminum, is first deposited on a substrate which is transparent to the X-ray radiation; a layer of photoresist then deposited on the aluminum; the photoresist exposed with the desired pattern; the photoresist developed to expose the aluminum in the areas where it is desired to deposit the absorber material; the aluminum etched away from these areas undercutting the resist; the absorber deposited through the openings in the resist and aluminum and the resist then lifted off.

Optionally, the remaining aluminum may also be removed. In the specifically illustrated embodiment, the substrate is a thermoplastic polyester, polyethylene teraphthalate sold under the tradename of Mylar. Alternatively a thermoset polyimide such as the material Kapton, a trademark of duPont, may be used. The preferred material for the absorber is gold with an adhesion layer of chromium between the gold and the substrate.

DETAILED DESCRIPTION OF THE INVENTION

As illustrated by FIG. 1, a layer 11 of aluminum is first deposited on substrate of a material which is transparent to the radiation with which the mask of the present invention is to be used, e.g. X-rays. This can be done using any well known technique such as evaporation, sputtering, etc. Subsequently, a layer of photoresist is placed over the aluminum. The photoresist is exposed using conventional UV lithography and the photoresist then developed. The results of these steps are illustrated by FIG. 1*b*. Shown is the photoresistr 15 remaining after development atop the substrate 11. At the edges which have been developed, there is a standing wave pattern 17. What the aluminum does is to act as a reflector for the UV radiation so that the reflected radiation combines with the incident radiation to form this standing wave pattern. This permits defining a fairly square edge in the photoresist and permits using conventional UV lithography, as opposed to the electron beam lithography necessary for the conventional lift-off technique.

Figure 1A:
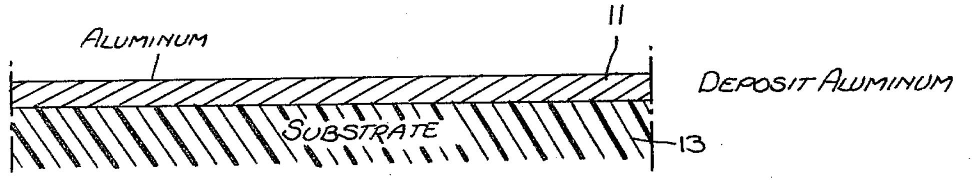
FIGS. 1*a–f* illustrate the basic process steps in the mass-making process of the present invention.
Figure 1B:
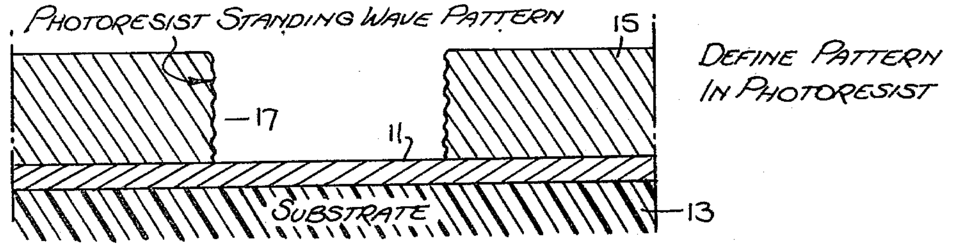
Figure 1C:
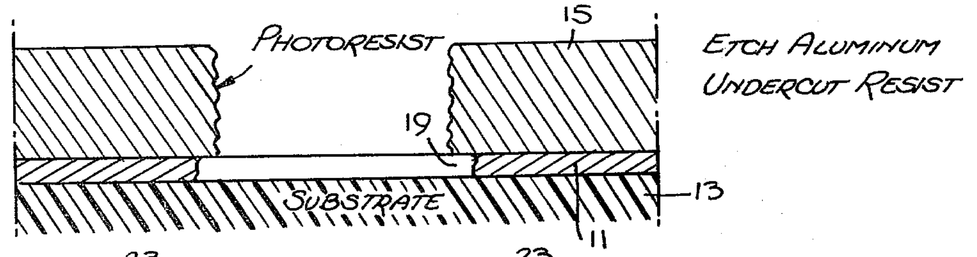

Next, as illustrated by FIG. 1*c* the aluminum is etched away. Naturally, only the aluminum in the exposed areas will be etched. Etching is carried out so as to provide an undercut 19 below the remaning photoresist 15.

Figure 1D:
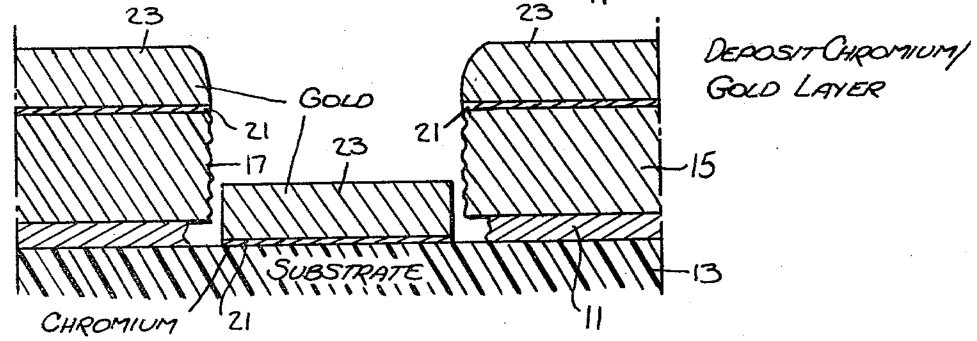
Figure 1E:
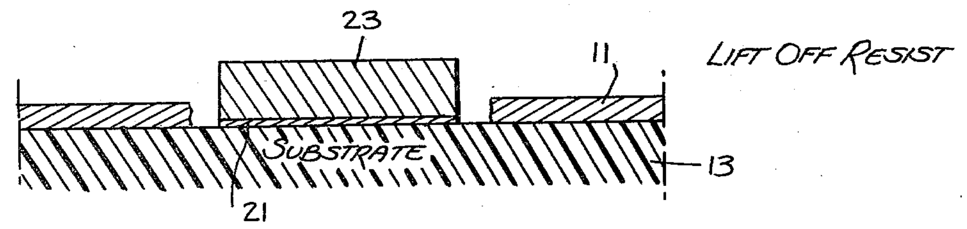
Figure 1F:
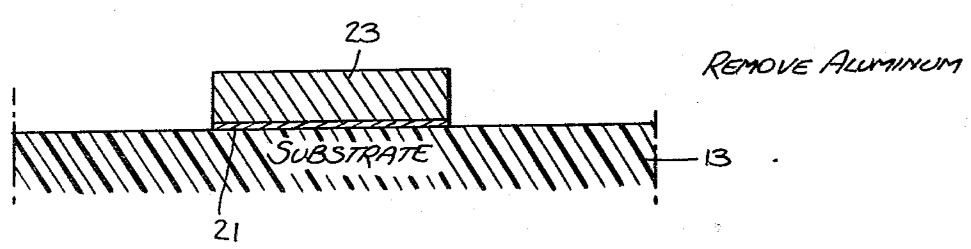

Next, as illustrated by FIG. 1*d* gold is evaporated onto the structure of FIG. 1*c*. Evaporation of gold is preferably preceded by the evaporation of a thin layer 21 of chromium to aid in adhesion to the substrate 13. The evaporation of gold, or alternatively another absorber material, takes place in the open area onto the substrate or chromium layer 1 and also onto the photoresist 15. As illustrated by FIG. 1*e* the resist is then lifted off using a suitable solvent, leaving the gold absorber pattern 23 spaced from the remaining aluminum layer 11. Thereafter, as illustrated by FIG. 1*f*, the aluminum can be removed using a suitable etchant. However, it should be noted that this step is optional when making an X-ray mask, since attenuation of the soft X-rays by aluminum is negligible and the aluminum film may be useful in increasing lateral heat transfer and hence limiting thermal gradients.

EXAMPLE

In producing a mask according to the present invention, a Mylar mask membrane made of a capacitor grade Mylar in a thickness ranging from 3 to 25 microns and in diameters up to 12 centimeters was stretched evenly over a stainless steel ring and anchored at the periphery. A second stainless steel ring was then press fitted over the first in order to grip the membrane around the periphery. Alternatively, the membrane is stretched over and exposed to a pyrex substrate in the center of which is a hole of appropriate size to permit X-ray transmission through the membrane.

A 0.2 micron layer of aluminum was first deposited on the substrate by evaporation whereafter a AZ1370 photoresist (obtainable from the Shipley Co., Newton, Mass.) 0.9 microns thick was deposited on the aluminum. The photoresist was exposed using a Perkin-Elmer projection mask aligner with the photoresist coated resist membrane 13 of FIG. 1 accurately located in the focal plane of the instrument. The photoresist was exposed through a master mask using UV radiation.

Figure 2:
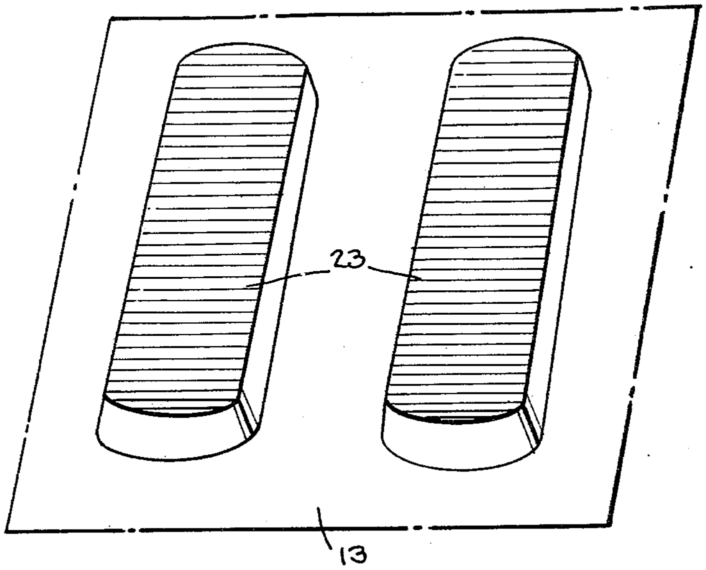
FIG. 2 is a drawing based on a photograph of a pair of lines produced in accordance with the method of the present invention.
Figure 3:
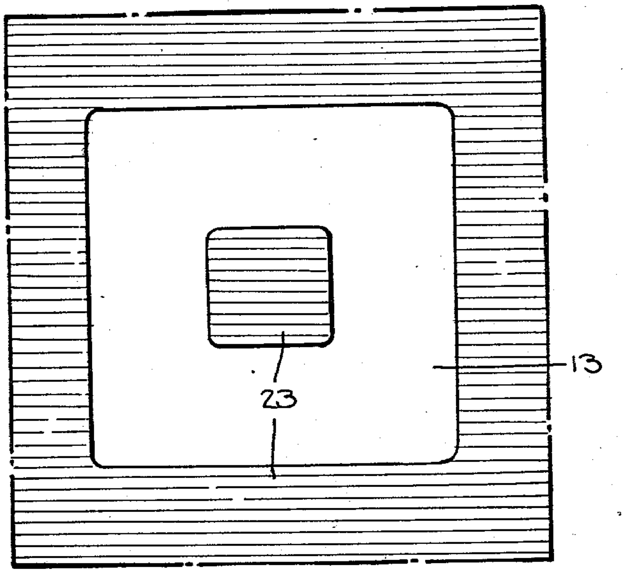
FIG. 3 is a drawing of a photograph of an isolated feature produced with the method of the present invention.

The aluminum was then chemically etched in phosphoric acid/5% nitric acid to obtain the pattern shown on FIG. 1*c*. A chromium adhesive layer approximately 200 Å thick was then evaporated over the photoresist, whereafter a gold absorber layer was evaporated to a thickness of approximately 0.6 microns. The evaporation distance was made long, i.e. 27 centimeters in order to shadow the deposition on the standing wave pattern 19. In operation, the photoresist undercut limited the minimum feature dimension to about three times the aluminum thickness, e.g. 0.6 microns. The photoresist was then dissolved in acetone to produce a lifted off gold pattern as illustrated by FIG. 1*e*. The remaining aluminum was then etched off with phosphoric acid/5% nitric acid mixture. Using this process, a pattern having both open and isolated features was obtained as illustrated by FIGS. 2 and 3. Lines of gold 2 microns wide and a half micron thick and having a square edge profile were produced as shown on FIG. 2. Results show that the standing wave pattern of the resist is not replicated in the gold. Furthermore, it was found that the aluminum etch step that undercuts the resist is not critical since line width is determined only by the photoresist pattern.

Features with 1 μm lines and spacing have also been produced. In this case contact printing was used in place of the mask aligner to define the resist pattern. The technique can be used with other high resolution exposure techniques to produce finer patterns.

Tests also showed that there are potential limitations on the use of mylar membranes because of their surface roughness. Tests have shown that where an inclusion in the membrane lies wholly within the resist pattern, no detrimental effect is observed, provided the gold coverage is adequate. The inclusion simply results in a bulge in the gold pattern. Furthermore, observation of inclusions at the edge of the pattern also had no detrimental effect, again simply causing a bulge. However, such inclusions may have more serious effects on smaller features.

A limitation on the process of the present invention is the thick photoresist layer that is required. In addition, it is necessary to control the temperature of the membrane during gold deposition since heating can cause cracks in the gold because of the large difference in thermal expansion between the gold and stretch Myler membrane. In carrying out the process described above, thermal control was achieved by cementing a heat sink to the back surface of the membrane.

At present, Mylar is considered a candidate substrate material. However, as noted above Kapton offers similar advantages to Mylar. Both materials are inexpensive and commercially available in thin film form and simple to fabricate. Furthermore, they are transparent to all X-ray wave lengths presently under consideration in addition to being transparent in the visible range permitting optical alignment techniques to be used. Furthermore, they permit large diameter, unsupported membranes, which are sufficiently rugged to withstand normal handling without damage to be fabricated. Other possibilities for membranes which have been suggested in the art are silicon, aluminum oxide, and silicon nitride in thicknesses up to a few micrometers. It is not believed that these have all of the advantages of Mylar or Kapton since, for example they do not have the transparency in the visible range in all cases and some, for example silicon, have an absorption edge limit which limits the use to wave lengths longer than 6.75 Å. Also, as noted above, other absorber materials may be used but are only as easy to work with as gold.

Although the mask of the present invention is particularly useful in X-ray lithography, the masks made according to the present invention can also be useful in UV lithography. Although the line thicknesses may be different, the method of the present invention still is advantageous in that square edges on the absorber are generated.

What is claimed is:

1. A method of making a lithography mask comprising:
   (a) depositing on a substrate which is transparent to the radiation to be used in the lithography process a thin layer of a material which is reflective to ultraviolet radiation;
   (b) covering said reflective layer with a layer of photoresist;
   (c) exposing the photoresist with UV radiation through a master mask to thereby expose areas at which radiation absorbers are to be located;
   (d) developing the photoresist to expose the reflective layer in said areas;
   (e) etching the reflective layer away to expose the substrate and to provide an undercut;
   (f) depositing a layer of a material which is opaque to the radiation with which the mask is to be used on the substrate; and
   (g) lifting off the resist and unwanted portions of said opaque material.

2. The method according to claim 1 and further including the step of removing the remainder of said reflective layer after lifting off said resist.

3. The method according to claim 2 wherein said reflective layer comprises a layer of aluminum.

4. The method according to claim 1 wherein said reflective layer comprises a layer of aluminum.

5. The method according to claim 1 wherein the radiation with which said mask is to be used comprises X-ray radiation and wherein said material opaque to said radiation is gold.

6. The method according to claim 4 wherein said step of depositing said layer of gold comprises evaporating said gold onto the said substrate.

7. The method according to claim 6 and further including the step of evaporating a thin layer of chromium on said substrate before evaporating said gold.

8. The method according to claim 1 wherein the thickness of said photoresist layer is approximately 1 ½ times the thickness of the material opaque to said radiation and wherein the thickness of said reflective layer is approximately one-third the thickness of said layer of paque material.

9. The method according to claim 1 wherein said substrate material is selected from the group consisting of a thermoset polyimide and polyethylene teraphthalate.

10. A method of making a mask for use in X-ray lithography comprising:
   (a) depositing a thin layer of aluminum on a substrate selected from the group consisting of a thermoset polyimide film and a film of polyethylene terephthalate;
   (b) depositing on said layer of aluminum a layer of photoresist which is sensitive to UV radiation;
   (c) exposing said photoresist, through a master mask, to UV radiation;
   (d) developing said photoresist to expose said aluminum layer in areas where it is desired to deposit an X-ray absorber;
   (e) etching said aluminum layer in the areas which are exposed to remove said aluminum layer and to provide an undercut under the remaining resist layer;
   (f) evaporating a thin layer of chromium on said substrate;
   (g) evaporating a layer of gold over said chromium; and
   (h) lifting off said resist to leave remaining on said substrate a pattern of gold absorbers and, spaced therefrom areas of said aluminum layer.

11. The method according to claim 10 and further including the step of removing the remaining aluminum layer on said substrate.

12. The method according to claim 11 wherein said aluminum layer is approximately 0.2 microns thick, said photoresist layer approximately 0.9 microns thick and said gold layer approximately 0.6 mirons thick.

* * * * *

UNITED STATES PATENT AND TRADEMARK OFFICE

CERTIFICATE OF CORRECTION

PATENT NO. : 4,293,624

DATED : Oct. 6, 1981

INVENTOR(S) : William D. Buckley

It is certified that error appears in the above-identified patent and that said Letters Patent are hereby corrected as shown below:

Column 2, line 11, change lft-off to --lift-off--

Column 2, line 21, change Devices, ED-2, 429, (1979) to --Devices, ED-22, 429, (1975).

Column 2, line 48, change Norelco Report 14, 122-131, 1967 to ---Norelco Report 14, 112-131, 1967.---

Signed and Sealed this

*Eleventh* Day of *May 1982*

[SEAL]

*Attest:*

GERALD J. MOSSINGHOFF

*Attesting Officer* *Commissioner of Patents and Trademarks*